United States Patent [19]

Okumura et al.

[11] Patent Number: 5,124,687
[45] Date of Patent: Jun. 23, 1992

[54] POWER APPARATUS, POWER TRANSMISSION/DISTRIBUTION UNIT, AND TRIPPING METHOD THEREFOR

[75] Inventors: Kiyoshi Okumura; Tokio Yamagiwa; Yoshinori Tagawa; Takaaki Kawada; Masaru Fukuoka, all of Hitachi, Japan

[73] Assignee: Hitachi, Ltd., Tokyo, Japan

[21] Appl. No.: 574,085

[22] Filed: Aug. 29, 1990

[30] Foreign Application Priority Data

Aug. 30, 1989 [JP] Japan .................................. 1-221484

[51] Int. Cl.$^5$ ............................................. G08B 21/00
[52] U.S. Cl. .................................. 340/647; 340/644; 324/551; 361/131
[58] Field of Search ................ 340/647, 644; 324/551, 324/552, 536; 361/42, 47, 48, 49, 50, 131

[56] References Cited

U.S. PATENT DOCUMENTS

| | | | |
|---|---|---|---|
| 3,881,766 | 5/1975 | Pratsch | 361/131 |
| 4,709,291 | 11/1987 | Eggert et al. | 361/2 |
| 4,757,263 | 7/1988 | Cummings, III et al. | 324/552 |
| 4,975,800 | 12/1990 | Oshita | 361/111 X |

FOREIGN PATENT DOCUMENTS

| | | |
|---|---|---|
| 3428322 | 2/1986 | Fed. Rep. of Germany . |
| 53-110690 | 3/1980 | Japan . |
| 1-313771 | 12/1989 | Japan .................................. 324/551 |

Primary Examiner—Jin F. Ng
Assistant Examiner—Jeffery A. Hofsass
Attorney, Agent, or Firm—Antonelli, Terry Stout & Kraus

[57] ABSTRACT

A power apparatus in which a particle in an enclosure of the apparatus containing an electric conductor therein is moved in the enclosure by an electric field so as to cause an abnormality of insulation. The apparatus includes a first sensor for detecting an existence position of the particle on the basis of a sound of collision of the particle against the enclosure, a second sensor for detecting a partial discharge generated in the enclosure, and a device for receiving respective detection signals from the first and second sensors, for judging the existence of insulation abnormality caused by the particle inside the enclosure, and for outputting a result of the judgment.

12 Claims, 3 Drawing Sheets

POWER APPARATUS, POWER TRANSMISSION/DISTRIBUTION UNIT, AND TRIPPING METHOD THEREFOR

BACKGROUND OF THE INVENTION

The present invention relates to a power apparatus, and particularly relates to a power apparatus, a power transmission/distribution unit, and a tripping method therefor, in which an abnormality of insulation caused by a foreign matter inside the apparatus can be diagnosed.

Recently, the demand of electric power has been increasing more and more, and the environment of social lives using electricity has been popularized, so that the supply of a superior electric power has been a social demand. This supply of a superior electric power means that an electric power with less change in voltage as well as in frequency is supplied without service interruption. Therefore a power apparatus must have less troubles. In a power apparatus, for example, in a circuit breaker, a transformer, a bus bar, etc. insulated with an $SF_6$ gas, a high voltage portion thereof is housed within an air-tight housing, and it is therefore difficult to visually find an abnormality inside this apparatus at the time of inspection.

Various methods of preventive maintenance for detecting an abnormality of an apparatus have been proposed. For example, as disclosed JP-A-55-37868, there has been proposed a method in which an alarm is generated in one of several stages correspondingly to a level detected by a detector.

Such a method of preventive maintenance puts much weight on how to detect accurately a signal relating to partial discharge, without taking into consideration the dealing way of countermeasure for a power apparatus after detecting an abnormality of the power apparatus as a result of deducing the shape and positional condition of a foreign matter moved in the power apparatus by the effect of an electric field. There has been therefore a problem that a maintainer of the power apparatus is perplexed with the countermeasure.

SUMMARY OF THE INVENTION

It is an object of the present invention to provide a power apparatus, a power transmission/distribution unit, and a tripping method therefor in which it is possible to deduce the shape and positional condition of a foreign matter moved in the power apparatus judge an abnormal state of the power apparatus, and give proper instructions of the countermeasure corresponding to the abnormal state.

In order to attain the foregoing object, according to an aspect of the present invention, the power apparatus in which there is a fear that a foreign matter in a housing of the apparatus containing an electric conductor therein will be moved in the housing by an action of an electric field so as to induce an abnormality of insulation, comprises: a first sensor for detecting an existence position of a foreign matter on the basis of a sound of collision of the foreign matter against the housing; a second sensor for detecting partial discharge generated in the housing; and means for receiving respective detection signals of the first and second sensors, judging the existence of insulation abnormality caused by the foreign matter inside the housing, and outputting a result of the judgment.

According to another aspect of the present invention, the power apparatus may be provided with a diagnosing means for diagnosing the state of insulation inside the apparatus so as to generate at least one of a signal for causing a display unit to display a result of the judgment and a signal for causing a warning device to generate an alarm.

According to a further aspect of the present invention, the power transmission/distribution unit constituted by apparatuses including a connection bus bar, a disconnector, a transformer, an arrester and so on which are connected to a system constituted by a conductor supported by insulating spacers, comprises: a judging means for judging the existence of a foreign matter moved by action of an electric field in a housing of at least one of the apparatuses, and outputting a trip command signal on the basis of a result of the judgment; and a tripping means for separating the unit from the system in response to the trip command signal from the judging means.

According to a still further aspect of the present invention, the method of tripping a power transmission/distribution unit constituted by apparatuses including a connection bus bar, a disconnector, a transformer, an arrester and so on which are connected to a system constituted by a conductor supported by insulating spacers, comprises the steps of: extracting a trip command signal from a signal indicating the existence of an abnormality of insulation caused by a movable foreign matter existing within at least one of the apparatuses; judging whether or not the unit can be subject to emergency stop upon generation of the trip command signal; making the unit emergently stop when the unit can be subject to emergency stop; and operating the system to move in a condition where emergency stop can be made so that the unit is separated from the system when the unit cannot be subject to emergency stop.

In the power apparatus having the above-mentioned configuration, the means for outputting a result of the judgment on the basis of the respective detection signals of the first and second sensors deduced the shape and positional state of a foreign matter inside the apparatus housing, judges an abnormality of insulation due to by the foreign matter and outputs a result of the judgment.

In the power apparatus having the above-mentioned configuration, the diagnosing means diagnoses the state of insulation effected by the foreign matter inside the apparatus so as to generate at least one of a signal for causing a display unit to display a result of the judgment and a signal for causing a warning device to generate an alarm.

The trip command signal outputting means judges the existence of an abnormality of insulation and supplies a trip command signal to the tripping means in accordance with the result of judgment to thereby separate the power transmission/distribution unit from the system or stop the operation of the unit.

BRIEF DESCRIPTION OF THE DRAWINGS

Other features and advantages of the present invention will be apparent from the following description taken in connection with the accompanying drawings, wherein.

DESCRIPTION OF THE PREFERRED EMBODIMENTS

Embodiments of the present invention will be described with reference to the drawings.

Figure 1:
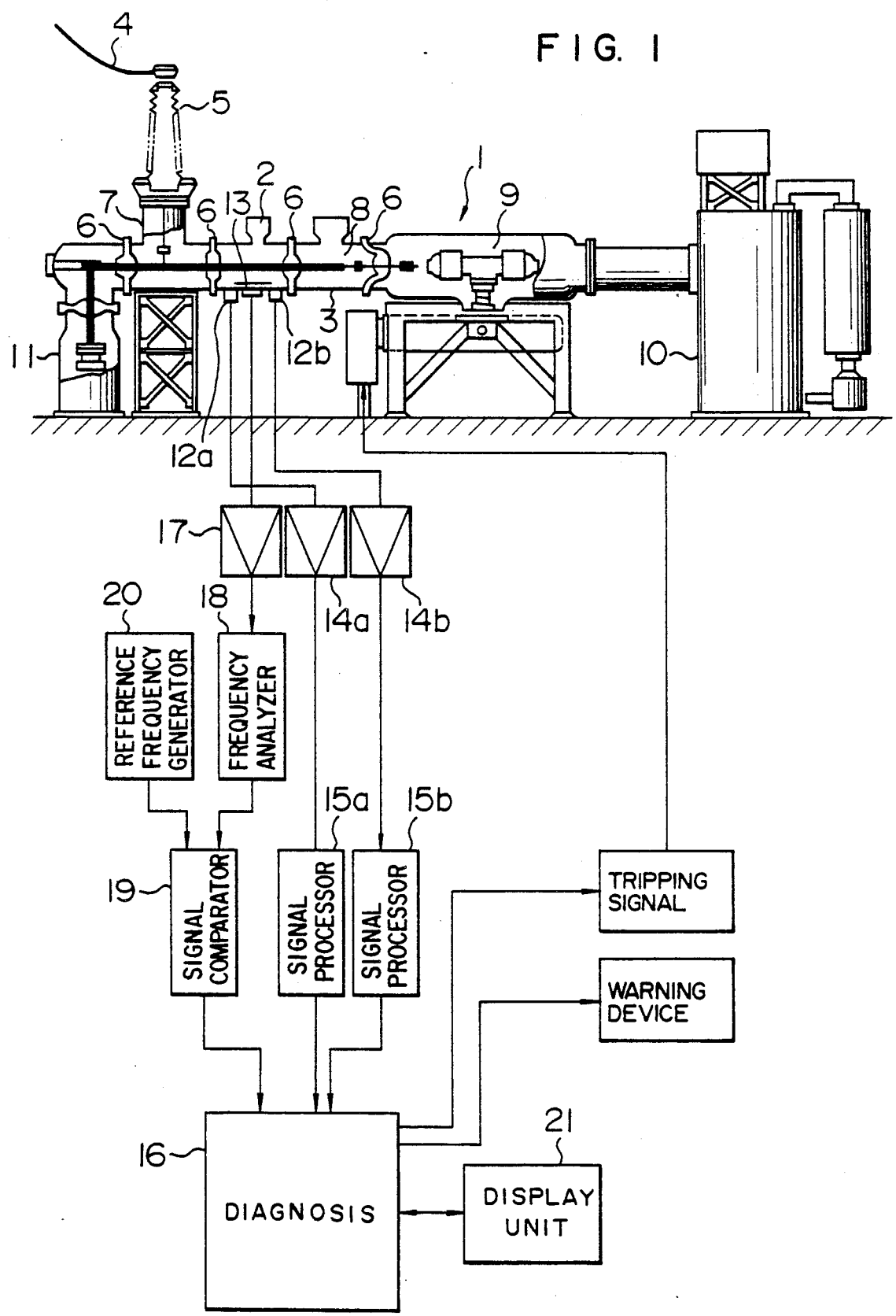
FIG. 1 is a configuration diagram illustrating an embodiment of the power apparatus according to the present invention.

FIG. 1 shows a gas insulated switchgear as an embodiment of the power apparatus according to the present invention. In FIG. 1, a gas insulated switchgear 1 is constituted by various means for switching such as a circuit breaker 9 and so on which are housed in a housing 3 connected to an earth potential. In the housing 3, an insulating gas such as $SF_6$ gas or the like superior in insulating and arc-extinguishing performances is enclosed. Electric power is led from an aerial wire 4 into the apparatus through a bushing 5, and supplied to a transformer 10 through a bus bar 7, a disconnector 8, the circuit breaker 9, etc. The bus bar is constituted by a conductor 7 supported by number of insulating spacers 6. An arrester 11 for restraining overvoltage is attached in the vicinity of a lead-in entrance for the aerial wire 4. This gas insulated switchgear 1 is connected to a system so as to constitute a power transmission/distribution unit.

Next, an embodiment of a diagnosing means provided on the above-mentioned gas insulated switchgear 1 will be described.

Figure 2:
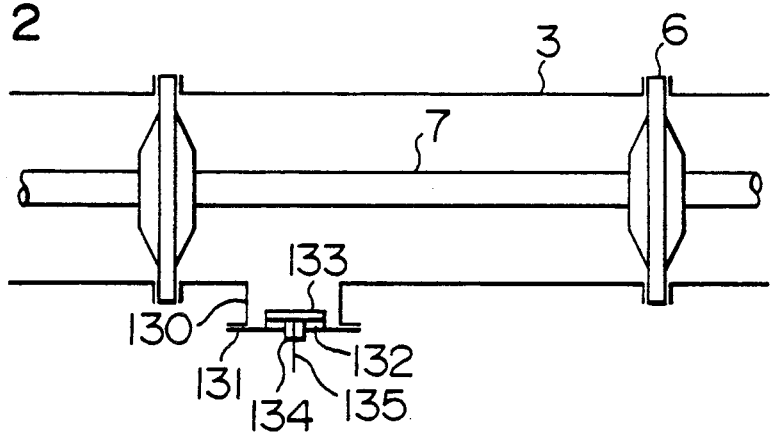
FIG. 2 is a diagram illustrating a specific embodiment of a second sensor to be used according to the present invention.

In the housing 3 of the gas insulated switchgear 1, there are provided a plurality of first sensors 12a and 12b for detecting the sound of collision of a foreign matter inside the housing 3 against the housing 3, and a second sensor 13 for detecting partial discharge generated inside the housing 3. For example, ultrasonic microphones are used as the above-mentioned first sensors 12a and 12b. As for the first sensors 12a and 12b, in order to prevent a malfunction caused by vibrations generated when rain drops or the like collide against the housing 3, two kinds of sensors having different detection frequency bands may be used as a pair. In the second sensor 13, for example, as shown in FIG. 2, an electrode 133 is attached through an insulator 132 onto a cover 131 for a hand hole 130 of the housing 3, and a lead wire 135 is connected to this electrode 133 through an insulating piece 134. In this arrangement, electric pulses caused by partial discharge are detected through electrostatic capacity division constituted by the electrostatic capacity between the conductor 7 and the electrode 133 and the electrostatic capacity between the electrode 133 and the cover 131. As such a detecting means by use of electrostatic capacity, the electrostatic capacity of the insulating spacers 6 may be used for detection, or a partial discharge current may be detected from an earth line connected with the housing 3. This second sensor 13 detects the partial discharge of frequency components in a range from 500 to 1500 MHz generated inside the housing 3 insulated with the $SF_6$ gas.

Returning to FIG. 1, the first sensors 12a and 12b are connected to amplifiers 14a and 14b respectively. The amplifiers 14a and 14b are connected to signal processing sections 15a and 15b respectively. The signal processing sections 15a and 15b are connected to a diagnosing section 16. The second sensor 13 is connected to an amplifier 17. The amplifier 17 is connected to a frequency analyzing section 18. This frequency analyzing section 18 analyzes the frequency of a signal detected by the second sensor 13. The frequency analyzing section 18 is connected to a signal comparing section 19. A reference frequency generating section 20 is connected to the signal comparing section 19 so as to supply thereto a reference frequency signal of, for example, the intermediate value 1000 MHz in the above-mentioned partial discharge of the frequency components in the range from 500 to 1500 MHz. The signal comparing section 19 is connected to the diagnosing section 16 so as to compare a detection signal from the second sensor 13 with the reference frequency signal from the reference frequency generating section 20 and supply the diagnosing section 16 with a judgment signal showing the fact as to whether this detection signal is larger than the reference frequency or not. The diagnosing section 16 detects the existence of a foreign matter inside the housing 3 on the basis of one of signals from the first sensors 12a and 12b, and detects an axial position of the foreign matter inside the housing 3 relative to the housing 3 on the basis of the signals from the first sensors 12a and 12b. The diagnosing section 16 also detects the generation of a needle-like electrode caused by a foreign matter, on the basis of a signal supplied as a result of frequency comparison from the signal comparing section 19 relating to the second sensor 13. On the basis of the result of this detection, the diagnosing section 16 decides a diagnostic result. Table 1 shows a diagnostic result obtained by the above-mentioned detection result and diagnostic result.

TABLE 1

| Detection result | | | | | | |
|---|---|---|---|---|---|---|
| Existense of foreign matter on housing side? | | Existence of partial discharge by needle-like electrode? | | | | |
| | | Yes | | | | |
| Yes | No | Large | Small | No | No. | Diagnosis result |
| ∘ | — | — | — | — | 1 | Small foreign matter exists on housing side. |
| — | ∘ | — | ∘ | — | 2 | Small foreign matter exists on conductor side. |
| ∘ | — | — | ∘ | — | 3 | Foreign matter having length exists on housing side. |
| ∘ | — | — | ∘ | ∘ | 4 | Inside partial discharge is generated by foreign |
| ∘ | — | ∘ | — | ∘ | 5 | matter housing side. Foreign matter is repeating floating and falling or many foreign matters exist. (Degree of partial discharge changes with correlation with the length of foreign matter. |
| ∘ | — | ∘ | — | — | 6 | Foreign matter longer than that of No. 3 exists on the housing side. |
| — | ∘ | ∘ | — | — | 7 | Foreign matter longer than that of No. 2 exists on |

TABLE 1-continued

| Detection result | | | | | |
|---|---|---|---|---|---|
| Existense of foreign matter on housing side? | Existence of partial discharge by needle-like electrode? | | | | |
| | Yes | | | | |
| Yes No | Large | Small | No | No. | Diagnosis result |
| | | | | | the housing side. |

Figure 5:
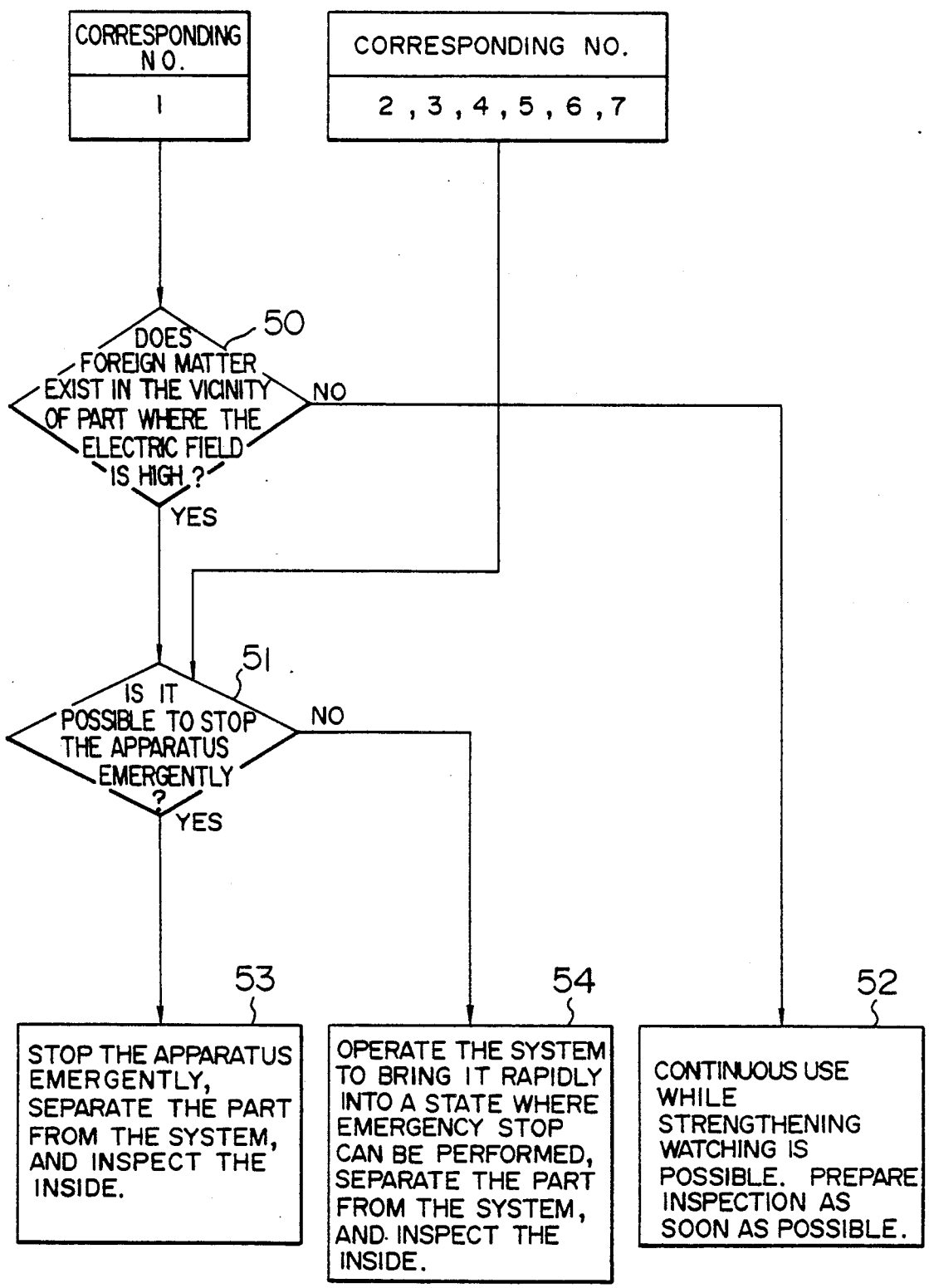
FIG. 5 is a flow chart for explaining the operation in the present invention.

Further, the diagnosing section 16 supplies the countermeasure processing contents to a display section 21 on the basis of the diagnostic result shown in Table 1 by a processing procedure shown in FIG. 5.

The reason why a diagnostic result can be obtained on the basis of the detection result as shown in the above Table 1 will be described.

As shown in the corresponding No. 1 in Table 1, in the case where a foreign matter is inside the housing 3 while no internal partial discharge is generated, the foreign matter exists on the earth side where the electric field is lower. Accordingly, it is possible to continuously use the power apparatus while strengthening the watching.

Figure 3:
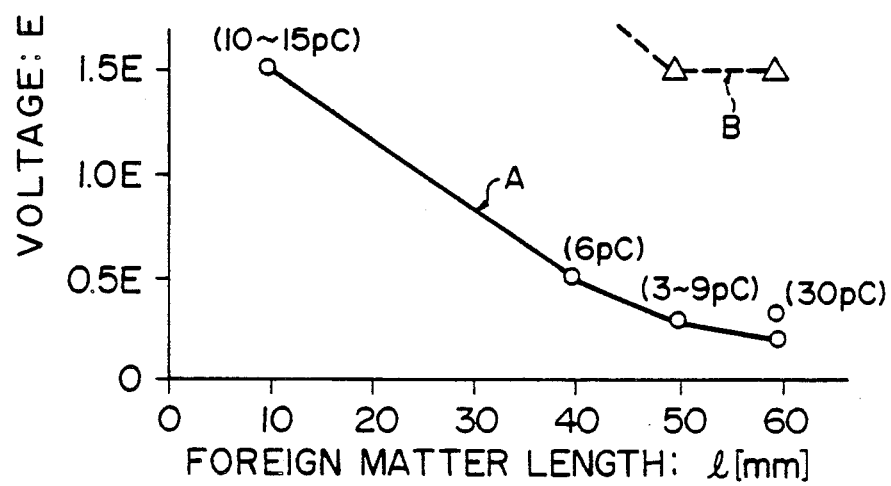
FIG. 3 is a characteristic diagram illustrating the relationship between the length of a foreign matter and a corona generating voltage or a flashover voltage when the foreign matter adheres to a conductor.

In the case of the corresponding No. 2 in Table 1, that is, in the case in which a foreign matter adheres onto the conductor 7 and internal partial discharge of a small value is generated, as is apparent from the relationship between the length of a foreign matter and a corona generating voltage or a flashover voltage shown in FIG. 3, it is possible to judge that a small foreign matter adheres on the conductor 7 where the electric field is high so that the state has become extremely dangerous. In FIG. 3, the characteristic curves A and B represent a corona generating voltage and a flashover voltage respectively.

Figure 4:
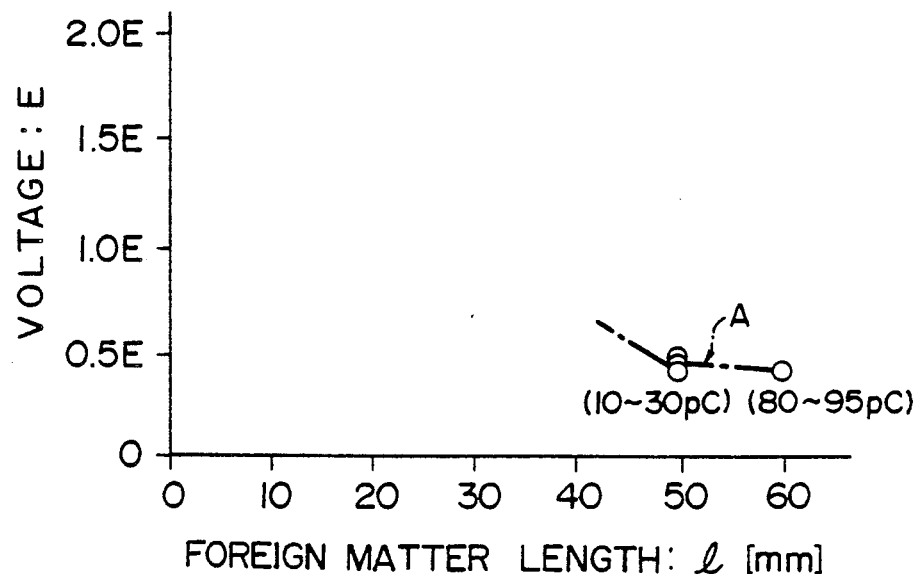
FIG. 4 is a characteristic diagram illustrating the relationship between the length of a foreign matter and a corona generating voltage when the foreign matter is on the apparatus housing side.

In the case of the corresponding No. 3 in Table, that is, in the housing where a foreign matter is on the housing 3 side and internal partial discharge of a small value is generated, as is apparent from the relationship between the length of a foreign matter and a corona generating voltage when the foreign matter is on the housing side as shown in FIG. 4, it is possible to judge that a foreign matter having a length exists in the form of a needle-like electrode on the inner surface of the housing 3. It is therefore possible to always know the degree of flashover danger of the apparatus by the intrusion of lightening or switching surge even in operating.

In the case of the corresponding No. 4 or 5 in Table 1, on the basis of the detection result, it is possible to judge that internal discharge is generated by a foreign matter adhering on the conductor 7 side at first and then the foreign matter repeats floating and falling or a number of foreign matters exist. This case can be also regarded as a dangerous state.

In the case of the corresponding No. 6, internal partial discharge of a large value is generated and a foreign matter is on the housing 3 side, so that, from FIG. 4, it is possible to judge that a foreign matter having a length becomes a needle-like electrode, and regard this case as a dangerous state.

In the case of the corresponding No. 7 in Table 1, on the contrary to the above-mentioned case of the corresponding No. 6, a foreign matter having a length exists as a needle-like electrode on the conductor 7 side where the electric field is high, so that this case can be also regarded as a dangerous state to the intrusion of a high voltage.

Although not shown in Table 1, even the case of the corresponding No. 1 can be a dangerous state according to the position of a foreign matter. That is, in a gas insulated substation apparatus, a live part such as a conductor is supported inside an air-tight housing (which is generally a metal housing for the sake of manufacturing and which is therefore grounded to prevent an electric shock caused by induction) in which an insulating gas is enclosed, and the insulating spacers 6 are used for support. If a conductive foreign matter or a matter having a dielectric constant different from the insulating spacers 6 adheres on the creeping of the insulating spacers 6, an electric field on the creeping is disturbed to cause electrostatic field concentration, so as to reduce its insulating performance extremely. In order to prevent the danger in this case, detection, is made as to whether a foreign matter exists in the vicinity of the insulating spacers 6 or not on the basis of signals from the first and second sensors 12a and 12b so that it is possible to judge the degree of flashover danger of the apparatus caused by a foreign matter.

Next, the operation of the above-mentioned embodiment of the present invention will be described with reference to the flow chart shown in FIG. 5.

If the diagnosing section 16 receives the above-mentioned detection result of the corresponding No. 1 shown in Table 1, the diagnosing section 16 judges, as shown in the diagnostic result in Table 1, that a small foreign matter exists on the housing 3 side. Then, as shown in the flow chart in FIG. 5, on the basis of signals from the first and second sensors 12a and 12b, the diagnosing section 16 judges whether the foreign matter is in the vicinity of a high electric field portion, that is, in the vicinity of the insulating spacers 6 (Step 50). Judging that the foreign matter is not in the vicinity of a high electric field portion, the diagnosing section 16 supplies the display section 21 with countermeasure contents represented by the reference numeral 52 in FIG. 5, that is, the contents that "It's possible to continuously use while strengthening watching. It's however necessary to prepare inspection as quickly as possible." Consequently, a maintainer can perform a countermeasure work according to the contents.

Next, if the judgment proves that the foreign matter is in the vicinity of a high electric field portion in Step 50 in FIG. 5, the diagnosing section 16 judges whether the power apparatus can be stopped emergently or not (Step 51). As a result, if it is possible to emergently stop the power apparatus, the diagnosing section 16 supplies the display section 21 with the contents represented by the reference numeral 53 in FIG. 5, that is, the contents that "Emergently stop the apparatus, separate the corresponding section from the system, and inspect the inside." If judgment proves that it is impossible to emergently stop the power apparatus in Step 51, the diagnosing section 16 supplies the display section 21 with the contents represented by the reference numeral 54 in FIG. 5, that is, the contents that "By operating the system, move the system to a state possible to emergently stop, separate the corresponding section from the system, and inspect the inside."

Next, in the case of the detection and diagnostic results shown in the corresponding Nos. 2 to 7 shown in Table 1, since there is a high degree of flashover danger of the power apparatus caused by a foreign matter, the diagnosing section 16 judges, in Step 51 shown in FIG.

5, whether it is possible to emergently stop the power apparatus or not, and in accordance with the result of judgment, supplies the display section 21 with the contents represented by the reference numeral 53 or 54 in FIG. 5.

The diagnosing section 16 may be connected to a tripping means for separating the unit from the system on the basis of a trip command signal.

As has been described, according to the embodiment of the present invention, it is possible to deduce the shape and existence position of a foreign matter moving in a power apparatus, forecast the rest life of the apparatus on the basis of the degree of the insulation abnormality caused by the foreign matter, and know the countermeasure therefore.

According to the present invention, it is possible to deduce the shape and existence position of a foreign matter moving in a power apparatus on the basis of detection signals, forecast the rest life of the apparatus, and judge the degree of danger, so that a maintainer can perform a proper treatment for the power apparatus in advance. As a result, it is possible to increase the reliability and safety.

Moreover according to the present invention, it is possible to give a maintainer instructions of a proper countermeasure in advance, so that the maintainer can quickly perform the countermeasure work.

What is claimed is:

1. A power apparatus in which foreign matter in an enclosure of said apparatus containing an electric conductor therein is moved in said enclosure by an electric field so as to cause an abnormality of insulation, said apparatus comprising:
    first sensor means for detecting a position of the foreign matter on the basis of a sound of collision of said foreign matter against said enclosure and for providing a detection signal indicative thereof;
    second sensor means for detecting a partial discharge generated in said enclosure and for providing a detection signal indicative thereof; and
    means for receiving respective detection signals from said first and second sensor means, for judging the existence of the insulation abnormality caused by said foreign matter inside said enclosure, and for outputting a result of said judgment.

2. A power apparatus according to claim 1, wherein upon reception of the detection signal from said first sensor means, said means for outputting a result of said judgment judges that the foreign matter exists on an inner side of said enclosure and outputs an instruction to permit continuous use of said apparatus.

3. A power apparatus according to claim 1, wherein upon reception of a detection signal from said second sensor means having a value smaller than a reference value therefor, said means for outputting a result of said judgment judges that a small particle of foreign matter adheres to said conductor within said enclosure, and outputs an instruction for an emergency stop of said apparatus.

4. A power apparatus according to claim 1, wherein upon reception of the detection signal from said first sensor means and a detection signal from said second sensor means having a value smaller than a reference value therefor, said means for outputting a result of said judgment judges that a particle of the foreign matter exists on the enclosure side and outputs an instruction for an emergency stop of said apparatus.

5. A power apparatus according to claim 1, wherein upon reception of a continuous detection signal from said first sensor means and a detection signal from said second sensor means having a value smaller than a reference value therefor, said means for outputting a result of said judgment judges that a particle of the foreign matter is one of repeating up and down movement between said enclosure and said conductor within said enclosure and a plurality of particles of the foreign matter are within said enclosure, and outputs an instruction for an emergency stop of said apparatus.

6. A power apparatus according to claim 1, wherein upon reception of the detection signal from said first sensor means and a detection signal from said second sensor means having a value larger than a reference value therefor, said means for outputting a result of said judgment judges that a long particle of the foreign matter exists on the enclosure side and outputs an instruction for an emergency stop of said apparatus.

7. A power apparatus according to claim 1, wherein upon reception of a detection signal from said second sensor means having a value larger than a reference value therefor, said means for outputting a result of said judgment judges that a particle of the foreign matter exists on the inner side of the enclosure and outputs an instruction for an emergency stop of said apparatus.

8. A power apparatus according to claim 1, wherein said first sensor means includes a plurality of first sensors and upon reception of detection signals from said plurality of said first sensors, said means for outputting a result of said judgment judges that a particle of the foreign matter exists in the vicinity of a strong electric field portion in one of the vicinity of an insulator of said enclosure, and an end portion of said conductor, and outputs an instruction for an emergency stop of said apparatus.

9. A power apparatus according to claim 1, further comprising a power transmission/distribution unit constituted by apparatuses including a connection bus bar, a disconnector, a transformer and an arrester which are connected to a system constituted by a conductor supported by insulating spacers, said power transmission/distribution unit comprising:
    judging means for judging a foreign matter moved by an electric field in an enclosure of at least one of said apparatuses, and for outputting a trip command signal on the basis of a result of a judgment; and
    tripping means for separating said power transmission/distribution unit from said system in response to said trip command signal from said judging means.

10. A power apparatus in which foreign matter in an enclosure of said apparatus containing an electric conductor therein is moved in said enclosure by an electric field so as to cause an abnormality of insulation, said apparatus comprising:
    first sensor means for detecting a position of the foreign matter on the basis of a sound of collision of the foreign matter against said enclosure and for providing a detection signal indicative thereof;
    second sensor means for detecting a partial discharge generated in said enclosure and for providing a detection signal indicative thereof; and
    means for receiving respective detection signals from said first and second sensors means for judging the existence of the insulation abnormality inside said enclosure, and for generating at least one of a signal for the causing a display unit to display a result of said judgment and a signal for causing a warning device to generate an alarm.

11. A power apparatus which is provided with devices including at least one of a gas-insulated and sectioned circuit breaker, a disconnector, and a connection bus bar so as to constitute a gas insulated switch gear, said apparatus comprising:

first sensor means for detecting a position of a particle moved within an enclosure of at least one of said devices on the basis of a sound of collision of said particles against said enclosure and for providing a detection signal indicative thereof;

second sensor means for detecting a partial discharge generated inside said enclosure and for providing a detection signal indicative thereof; and means connected to said first and second sensors means so as to receive respective detection signals from said first and second sensor means, to thereby judge an abnormality of insulation caused by said particle inside said enclosure, and for outputting a result of said judgment.

12. A method for judging an abnormality of insulation of a power apparatus in which foreign matter in an enclosure of the apparatus containing an electric conductor therein is moved in the enclosure by an electric field so as to cause the abnormality of insulation, comprising the steps of:

detecting with first sensor means a position of the foreign matter on the basis of a sound of collision of the foreign matter against the enclosure and providing a detection signal indicative thereof;

detecting with second sensor means a partial discharge generated in the enclosure and providing a detection signal indicative thereof; and judging the existence of the insulation abnormality caused by the foreign matter inside the enclosure based upon respective detection signals received from the first and second sensor means and outputting a result of the judgment.

* * * * *